United States Patent
He et al.

(10) Patent No.: US 11,574,919 B2
(45) Date of Patent: Feb. 7, 2023

(54) OPENINGS LAYOUT OF THREE-DIMENSIONAL MEMORY DEVICE

(71) Applicant: Yangtze Memory Technologies Co., Ltd., Hubei (CN)

(72) Inventors: Jia He, Hubei (CN); Haihui Huang, Hubei (CN); Fandong Liu, Hubei (CN); Yaohua Yang, Hubei (CN); Peizhen Hong, Hubei (CN); Zhiliang Xia, Hubei (CN); Zongliang Huo, Hubei (CN); Yaobin Feng, Hubei (CN); Baoyou Chen, Hubei (CN); Qingchen Cao, Hubei (CN)

(73) Assignee: YANGTZE MEMORY TECHNOLOGIES CO., LTD., Hubei (CN)

( * ) Notice: Subject to any disclaimer, the term of this patent is extended or adjusted under 35 U.S.C. 154(b) by 0 days.

(21) Appl. No.: 17/017,417

(22) Filed: Sep. 10, 2020

(65) Prior Publication Data

US 2021/0151458 A1 May 20, 2021

Related U.S. Application Data

(60) Division of application No. 16/046,475, filed on Jul. 26, 2018, now Pat. No. 10,804,283, which is a (Continued)

(30) Foreign Application Priority Data

Mar. 7, 2017 (CN) .......................... 201710134033.9

(51) Int. Cl.
*H01L 27/1157* (2017.01)
*H01L 27/11578* (2017.01)
(Continued)

(52) U.S. Cl.
CPC .... *H01L 27/11578* (2013.01); *H01L 27/1157* (2013.01); *H01L 27/11582* (2013.01);
(Continued)

(58) Field of Classification Search
CPC ......... H01L 27/11509; H01L 27/11526; H01L 27/11519; H01L 27/11514;
(Continued)

(56) References Cited

U.S. PATENT DOCUMENTS 9,190,499 B2 11/2015 Hirai et al.
9,412,617 B2 8/2016 Narishige et al.
(Continued)

FOREIGN PATENT DOCUMENTS

CN 103680511 A 3/2014
CN 105428319 A 3/2016
(Continued)

OTHER PUBLICATIONS

International Search Report and Written Opinion of the International Searching Authority directed to related International Patent Application No. PCT/CN2018/077716, dated May 30, 2018; 10 pages.

*Primary Examiner* — Natalia A Gondarenko
(74) *Attorney, Agent, or Firm* — Sterne, Kessler, Goldstein & Fox P.L.L.C.

(57) ABSTRACT

Embodiments of semiconductor devices and methods for forming the semiconductor devices are disclosed. In an example, a method for forming device openings includes forming a material layer over a first region and a second region of a substrate, the first region being adjacent to the second region, forming a mask layer over the material layer, the mask layer covering the first region and the second region, and forming a patterning layer over the mask layer. The patterning layer covers the first region and the second (Continued)

region and including openings corresponding to the first region. The plurality of openings includes a first opening adjacent to a boundary between the first region and the second region and a second opening further away from the boundary. Along a plane parallel to a top surface of the substrate, a size of the first opening is greater than a size of the second opening.

17 Claims, 12 Drawing Sheets

Related U.S. Application Data continuation of application No. PCT/CN2018/077716, filed on Mar. 1, 2018.

(51) Int. Cl.
| | |
|---|---|
| *H01L 29/66* | (2006.01) |
| *H01L 29/792* | (2006.01) |
| *H01L 21/28* | (2006.01) |
| *H01L 27/11582* | (2017.01) |

(52) U.S. Cl.
CPC .. *H01L 29/40117* (2019.08); *H01L 29/66833* (2013.01); *H01L 29/792* (2013.01)

(58) Field of Classification Search
CPC ......... H01L 27/11529; H01L 27/11531; H01L 27/11551; H01L 27/11597; H01L 27/11578; H01L 27/11582; H01L 27/1157; H01L 27/11573; H01L 27/11575; H01L 27/11587; H01L 27/1159; H01L 27/11592; H01L 27/11595; H01L 29/40117; H01L 29/792–7926; H01L 29/66833; H01L 29/4234–42352; H01L 2924/145–1453; H01L 21/02107; H01L 21/02164; H01L 21/02112; H01L 21/28158; H01L 21/28194; H01L 21/31; H01L 21/3105; H01L 21/311–31122; H01L 21/308; H01L 21/3081; H01L 21/3083; H01L 21/3088

USPC ........ 257/324, 314, 326, 329, 774; 438/128, 438/478, 591, 268

See application file for complete search history.

(56) References Cited

U.S. PATENT DOCUMENTS

| | | | |
|---|---|---|---|
| 9,543,022 | B2 | 1/2017 | Hashimoto et al. |
| 9,553,101 | B2 | 1/2017 | Kim et al. |
| 9,786,673 | B1 | 10/2017 | Cho et al. |
| 9,812,462 | B1* | 11/2017 | Pang ................. H01L 29/40117 |
| 2010/0213526 | A1* | 8/2010 | Wada ................. H01L 27/11578 257/314 |
| 2014/0264533 | A1 | 9/2014 | Simsek-Ege et al. |
| 2014/0284688 | A1 | 9/2014 | Hirai et al. |
| 2014/0303069 | A1 | 10/2014 | Wang et al. |
| 2015/0076586 | A1* | 3/2015 | Rabkin ............. H01L 27/11578 257/324 |
| 2015/0214242 | A1 | 7/2015 | Lee |
| 2015/0263035 | A1 | 9/2015 | Tsuji et al. |
| 2016/0267991 | A1 | 9/2016 | Hashimoto et al. |
| 2016/0276264 | A1* | 9/2016 | Noda ................. H01L 27/11519 |
| 2016/0343727 | A1* | 11/2016 | Kim .................. H01L 27/11573 |
| 2018/0122906 | A1* | 5/2018 | Yu ..................... H01L 27/11556 |
| 2019/0013327 | A1 | 1/2019 | He et al. |

FOREIGN PATENT DOCUMENTS

| | | |
|---|---|---|
| CN | 106847821 A | 6/2017 |
| EP | 2819169 A2 | 12/2014 |
| JP | 2014-017406 A | 1/2014 |
| JP | 2014-187324 A | 10/2014 |
| JP | 2015-012296 A | 1/2015 |
| JP | 2015-142133 A | 8/2015 |
| JP | 2015-177053 A | 10/2015 |
| JP | 2016-170836 A | 9/2016 |
| KR | 10-2015-0002947 A | 1/2015 |
| KR | 10-2015-0035583 A | 4/2015 |
| KR | 10-2015-0089138 A | 8/2015 |
| KR | 10-2018-0021563 A | 3/2018 |

\* cited by examiner

OPENINGS LAYOUT OF THREE-DIMENSIONAL MEMORY DEVICE

CROSS-REFERENCE TO RELATED APPLICATIONS

This application is a divisional application of U.S. patent application Ser. No. 16/046,475, filed on Jul. 26, 2018, which claims priority to Chinese Patent Application No. 201710134033.9 filed on Mar. 7, 2017 and PCT Patent Application No. PCT/CN2018/077716 filed on Mar. 1, 2018, the entire content of which are incorporated herein by reference.

BACKGROUND

Embodiments of the present disclosure relate to three-dimensional (3D) memory devices and fabrication methods thereof.

Semiconductor memories can be divided into volatile memory and non-volatile memory according to their operating characteristics. Volatile memory refers to memory devices that can lose data storage when external power is not provided. Volatile memory includes, e.g., static RAM (SRAM), dynamic RAM (DRAM), and synchronous DRAM (SDRAM). Nonvolatile memory includes, e.g., read only memory (ROM), electrically programmable ROM (EPROM), electrically erasable programmable ROM (EEPROM), flash memory, phase change RAM (PRAM), magnetic RAM (MRAM), resistive RAM (RRAM), and ferroelectric RAM). Currently, flash memory is an important type of non-volatile memory that includes NOR flash memories and NAND flash memories.

As demand for integration and storage continues to increase, 3D (three-dimensional) NAND memory has emerged. A 3D NAND memory is a new type of product based on planar NAND memory. The main feature of 3D NAND memory is the three-dimensional structure, evolved from planar structures. The three-dimensional structure greatly saves the chip layout area and reduces the manufacturing cost.

BRIEF SUMMARY

Embodiments of 3D memory architectures and fabrication methods thereof are disclosed herein.

According to an embodiment of the present disclosure, a method for forming a semiconductor structure is provided. In an example, the method includes providing a substrate. The substrate can include a first region along an extending direction for forming channel holes, and second regions on both sides of the first region. A direction pointing from the first region to a second region along a direction parallel to the top surface of the substrate is a first direction, and a direction perpendicular to the first direction is a second direction. The method can also include forming a stack structure over the substrate. The stack structure can include a plurality of first material layers and a plurality of second material layers stacking alternatingly. A second material layer can be formed between two adjacent first material layers. The method can further include forming a photoresist layer over the stack structure. The photoresist layer can include a plurality of patterned openings exposing top portions of the stack structure corresponding to the first region. The plurality of patterned openings can be arranged in an array along the first direction and the second direction. Patterned openings adjacent to the second region along the first direction can be referred to as first openings, and the rest of the patterned openings can be referred to as second openings. The size of a first opening can be greater than the size of a second opening. For a first opening, the dimension along the first direction can be greater than the dimension along the second direction. The photoresist layer can be used as an etch mask for etching the stack structure to form channel holes that expose the substrate at the bottoms of the channel holes.

In some embodiments, for a first opening, the dimension along the first direction is greater than the dimension along the second direction by about 2 nm to about 3 nm.

In some embodiments, along the second direction, the dimension of a first opening is greater than the dimension of a second opening by about 1 nm to about 2 nm.

In some embodiments, along a plane parallel to the top surface of the substrate, a second opening has a cross-section of a circular shape and a first opening has a cross-section of an oval shape. In some embodiments, along the second direction, the dimension of the first opening is greater than the diameter of the second opening.

In some embodiments, along the first direction, adjacent patterned openings are arranged in a staggered configuration.

In some embodiments, along the first direction, the array of patterned openings includes an odd number of rows. In some embodiments, along a direction from a second region pointing to the first region, the distance between adjacent patterned openings decreases, and the distances between the middle row and the two adjacent rows can be the same. In some embodiments, along the first direction, the array of patterned openings includes an even number of rows. In some embodiments, along the direction from a second region pointing to the first region, the distance between adjacent patterned openings decreases.

In some embodiments, along the direction pointing from a second region to a first region, the distance between two adjacent patterned openings is about 2 nm to about 3 nm.

In some embodiments, the first material layers include silicon oxide layers, and the second material layers include silicon nitride layers.

In some embodiments, after formation of the stack structure over the substrate and before the formation of the photoresist layer, the method can further include forming a hard mask layer. In some embodiments, etching the stack structure includes using the photoresist layer as the etch mask to etch the hard mask layer, removing the etched photoresist layer, and using the hard mask layer to etch the stack structure after the removal of the etched photoresist layer.

In some embodiments, the hard mask layer can include carbon, silicon nitride, silicon oxide, and/or a composite stack of silicon nitride and silicon oxide.

According to embodiments of the present disclosure, a semiconductor structure is provided. In an example, the semiconductor structure includes a substrate. The substrate can include a first region along an extending direction for forming channel holes, and second regions on both sides of the first region. A direction pointing from the first region to a second region along a direction parallel to the top surface of the substrate is a first direction, and a direction perpendicular to the first direction is a second direction. The semiconductor structure can also include a stack structure over the substrate. The stack structure can include a plurality of first material layers and a plurality of second material layers stacking alternatingly. A second material layer can be formed between two adjacent first material layers. The semiconductor structure can further include a photoresist layer over the stack structure. The photoresist layer can include a plurality of patterned openings exposing top portions of the stack structure corresponding to the first region. The plurality of patterned openings can be arranged in an array along the first direction and the second direction. Patterned openings adjacent to the second region along the first direction can be referred to as first openings, and the rest of the patterned openings can be referred to as second openings. The size of a first opening can be greater than the size of a second opening. For a first opening, the dimension of along the first direction can be greater than the dimension along the second direction. The photoresist layer can be used as an etch mask for etching the stack structure to form channel holes that expose the substrate in the stack structure.

Compared with conventional technology, the technical solution provided by the present disclosure, including the disclosed methods and structures, has the following advantages.

According to the present technical solution, the dimension of a first opening can be greater than the dimension of a second opening, and the dimension of a first opening along the first direction is greater than the dimension of a second opening along the second direction. In one aspect, the first openings are adjacent to the second regions. That is, the first openings are located on the boundary of the first region. In semiconductor fabrication, when the stack structure is being etched to form channel holes, the etching loading effect (e.g., the dependence of etch rate on the quantity of material being etched) on the portion of stack structure for forming the first openings is different from the etching loading effect on the portion of stack structure for forming the second openings. Thus, by using the technical solution provided by the present disclosure, technical issues such as the size of a channel hole (e.g., corresponding to a first opening) being overly small and not being able to expose the substrate can be prevented or reduced. The electric current characteristics of the semiconductor channels can be improved. In another aspect, technical issue such as an overly small distance between a first opening and a second opening can be prevented or reduced. In semiconductor fabrication, trenches for forming word lines are often formed in the stack structure between adjacent semiconductor channels, and conductor layers are deposited to fill in the trenches. The provided technical solution can prevent or reduce the difficulty of subsequently filling conductor in the trenches between semiconductor channels formed from first openings and semiconductor channels formed from second openings. Thus, the formed semiconductor structure can have improved device performance.

In some embodiments, along the first direction, the array of patterned openings include an odd number of rows. In some embodiments, along a direction pointing from a second region to the first region, the distance between adjacent patterned openings decreases, and the distances between the middle row and the two adjacent rows can be the same. In some embodiments, along the first direction, the array of patterned openings includes an even number of rows. In some embodiments, along the direction from a second region pointing to the first region, the distance between adjacent patterned openings decreases. In semiconductor fabrication, filling the trenches for forming word lines is often obtained by filling conductor in the trenches, e.g., in the space between the semiconductor channels formed from the first openings and the semiconductor channels formed from the second openings. The conductor often has fluidity and can fill in other trenches along the direction pointing from a second region to the first region. Thus, by gradually reducing the distance between adjacent patterned openings, the conductor can fill in the trenches better because of the fluidity. The formed semiconductor structure can have improved device performance.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
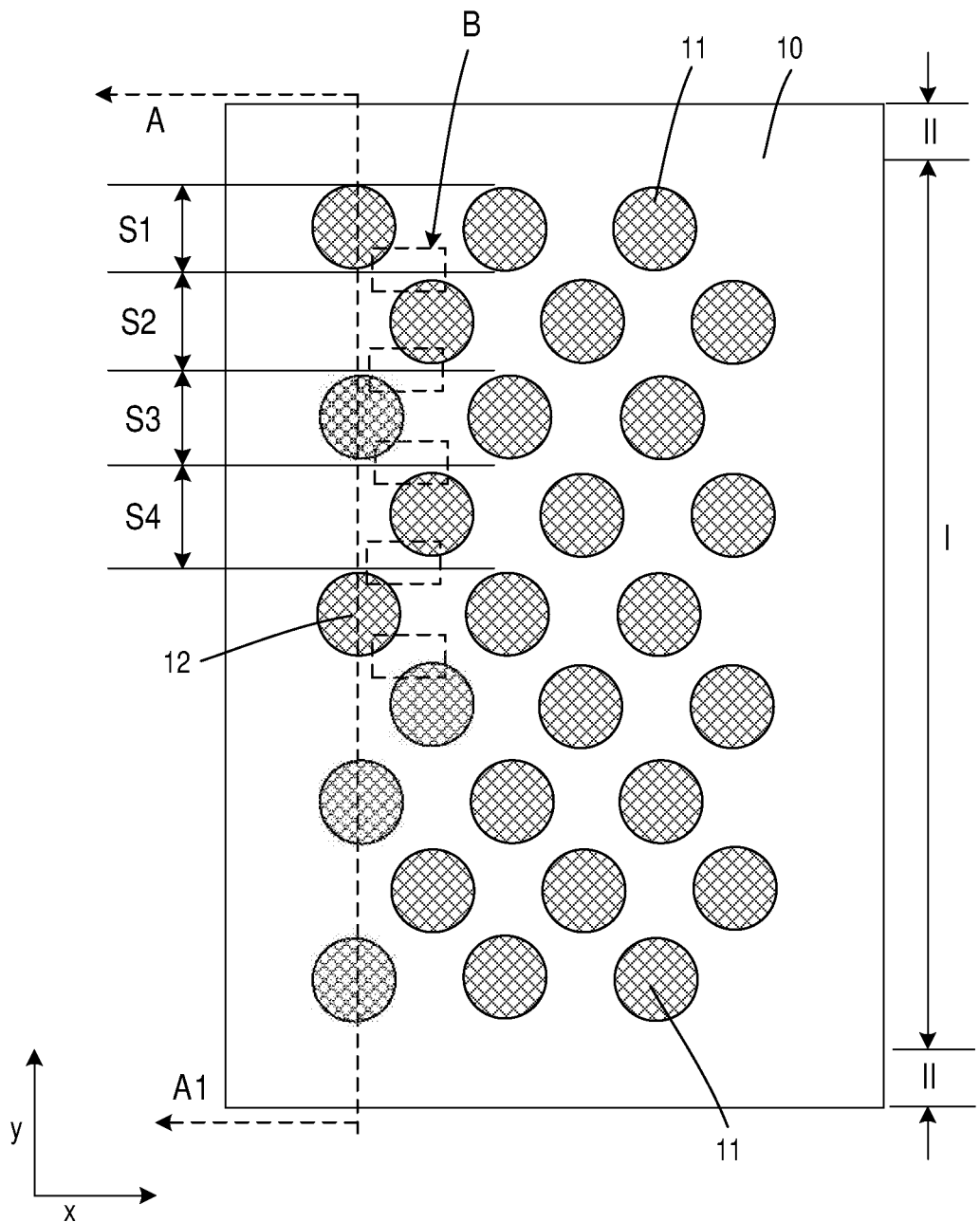
FIGS. 1-3 illustrate a fabrication process of a semiconductor structure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., 10%, ±20%, or +30% of the value).

As used herein, the term "3D memory device" refers to a semiconductor device with vertically oriented strings of memory cell transistors (referred to herein as "memory strings," such as NAND strings) on a laterally-oriented substrate so that the memory strings extend in the vertical direction with respect to the substrate. As used herein, the term "vertical/vertically" means nominally perpendicular to the lateral surface of a substrate.

In the present disclosure, the term "corresponding to" refers to the two objects having at least overlapped horizontal projections over a same area. For example, a substrate can include an area, and a layer over the substrate and covering the area can be referred to as being corresponding to the area, where the horizontal projection of the area and the horizontal projection of the layer overlap with each other. Accordingly, patterns formed over/in the layer (e.g., openings) can also be corresponding to the area. In some embodiments, the horizontal projection of the layer covers the horizontal projection of the area. In some embodiments, the top surface of the substrate is nominally horizontal.

Figure 2:
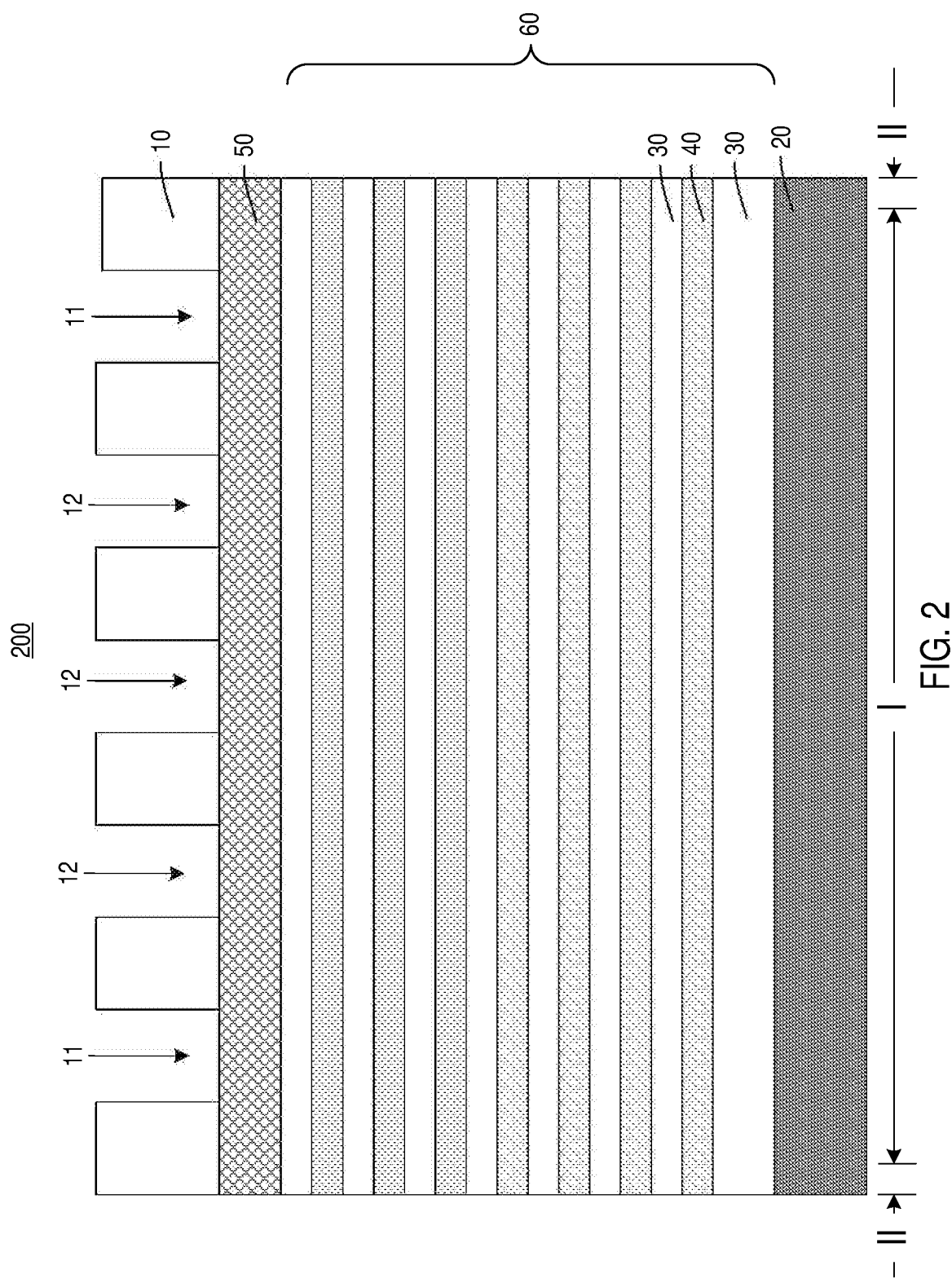
Figure 3:
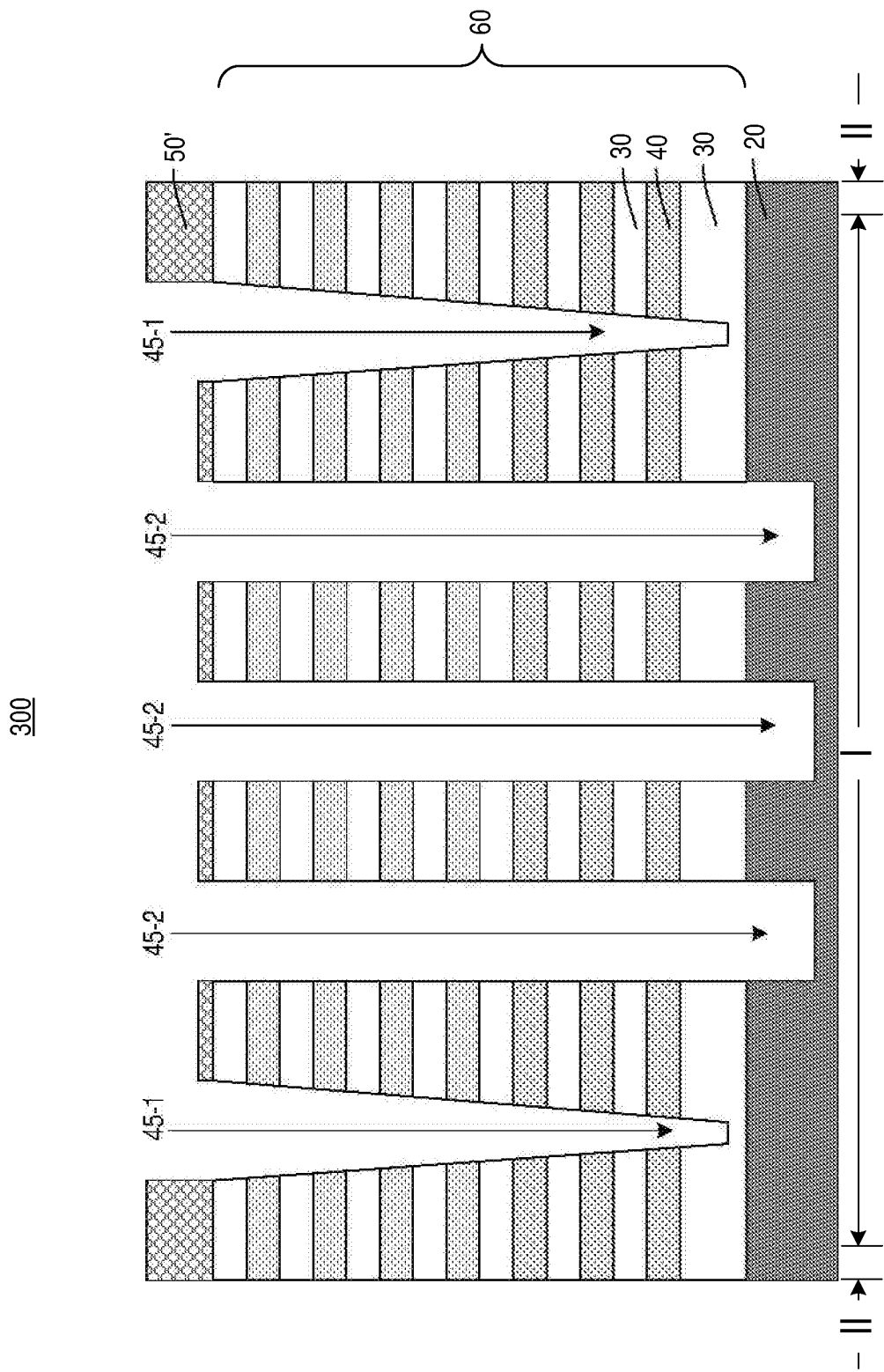

Issues with conventional technology are described as follows. FIGS. 1-3 illustrate part of a fabrication process of a conventional semiconductor structure. FIG. 1 illustrates a top view 100 of the semiconductor structure, and FIG. 2 illustrates a cross-sectional view 200 of the structure shown in FIG. 1 along A-A1 direction. As shown in FIGS. 1 and 2, the semiconductor structure includes a substrate 20, a stack structure 60 over substrate 20, a hard mask layer 50 over stack structure 60, and a patterned photoresist layer 10 over stack structure 60. Along the extending direction (e.g., the y-axis), the semiconductor structure includes a first region (I) and two second regions (II) on the two sides of the first region. The direction, parallel to the top surface of substrate 20, pointing from a second region to the first region is a first direction (e.g., along the y-axis). The direction, parallel to the top surface of substrate 20 and perpendicular to the first direction is a second direction (e.g., along the x-axis).

Stack structure 60 can be a dielectric stack. For example, stack structure 60 can include a plurality of silicon oxide layers 30 and a plurality of silicon nitride layers 40 arranged alternatingly. A silicon nitride layer 40 is formed between two adjacent silicon oxide layers 30. Hard mask layer 50 includes dielectric material, e.g., silicon nitride, and covers first region I and second regions II. Patterned photoresist layer 10 is disposed over hard mask layer 50 and includes a plurality of openings to expose portions of hard mask layer 50 corresponding to first region I. The plurality of openings is arranged in an array along the first direction and the second direction. As shown in FIGS. 1 and 2, along the first direction, openings adjacent to second regions II are first openings 11, and the rest of the openings are second openings 12.

First openings 11 each has a same dimension as second openings 12 along the first direction and the second direction. Specifically, along the x-y plane, first openings 11 and second openings 12 each has a circular shape. Along the first direction, openings of adjacent rows are arranged in a staggered manner, and the distance (S) between adjacent openings is the same. Referring to FIG. 1, S1=S2=S3=S4. Then, patterned photoresist layer 10 is used as an etch mask to pattern hard mask layer 50 to form openings (e.g., first openings 11 and second openings 12) in hard mask layer 50. After patterning hard mask layer 50, patterned photoresist layer 10 is removed.

FIG. 3 illustrates a cross-sectional view of the semiconductor structure after the hard mask layer 50 is patterned and stack structure 60 is etched using the patterned hard mask layer 50' as the etch mask. As shown in FIG. 3, by etching stack structure 60, channel holes 45 are formed in stack structure 60. Channel holes 45-1 refer to the device openings at the boundaries of first region I and formed from etching through first openings 11, and channel holes 45-2 refer to the rest of the device openings and formed from etching through second openings 12.

As shown in FIG. 3, in the fabrication process, when patterning hard mask layer 50, the etch rate of patterned hard mask layer 50' away from the boundaries of first region I is higher than the etch rate of patterned hard mask layer 50' close to the boundaries of first region I, causing the mask opening formed from a first opening 11 to have a higher aspect ratio (e.g., the ratio of the depth of an opening to the width of the opening) than the mask opening formed from a second opening 12. As a result, when etching stack structure 60 using patterned hard mask layer 50', the etching loading effect of the portions of stack structure 60 corresponding to first openings 11 is different from the etching loading effect of the portions of stack structure 60 corresponding to second openings 12. Accordingly, the etch rate of the portions of stack structure 60 corresponding to first openings 11 is less than the etch rate of portions of stack structure 60 corresponding to second openings 12, causing a channel hole 45-1 to have a depth and width smaller than a channel hole 45-2. Further, under etch can occur in channel holes 45-1, causing channel holes 45-1 more susceptible to not exposing substrate 20. Electric current may not flow through the semiconductor channels subsequently formed in channel holes 45-1 into substrate 20, and the electrical performance of the semiconductor structure can be impaired.

Subsequently, trenches for forming word lines are formed in stack structure 60 by removing silicon nitride layers 40 between adjacent silicon oxide layers 30, and the silicon nitride between channel holes 45 in each trench is etched away. Tungsten is then filled into the trenches to form word lines. Specifically, tungsten is often filled into the space between channel holes 45-1 and channel holes 45-2 (e.g., region B in FIG. 1) of a trench. Tungsten then flows towards the inner portion of first region I (e.g., along directions substantially pointing from second regions II to first regions I) due to fluidity, to fill in the space in other parts of the trench. Because the distance between openings of adjacent rows is the same, it can be difficult to fill metal into the space between channel holes 45-1 and channel holes 45-2 along directions substantially pointing from second regions II to first region I.

The present disclosure provides a semiconductor structure and method for forming the semiconductor structure. According to the methods, device holes (e.g., any holes formed in a semiconductor structure, including channel holes) in regions more susceptible to etching loading effect are formed using photoresist openings having different (e.g., larger) sizes to compensate the under etch caused by the etching loading effect. The sizes of the photoresist openings for forming the device holes can vary (e.g., become smaller) gradually as the photoresist openings are located further away from the regions most susceptible to the etching loading effect. As an example, photoresist openings in regions affected most by the etching loading effect have the largest dimensions, and photoresist openings in regions least susceptible to the etching loading effect have the smallest dimensions. The change of dimensions of a photoresist opening can be made along desired directions to accommodate the layout of the semiconductor structure, so that the overall layout (e.g., the number of parts and the relative position between parts) of the semiconductor structure nor the number of photoresist openings do not need to change after the dimension change. Also, dimensions of photoresist openings can be adjusted along directions conductor is flown to allow distance between two adjacent photoresist openings/device holes to change (e.g., be smaller) and facilitate better subsequent filling of the conductor between device holes. The dimensions of photoresist openings for compensating etching loading effect and facilitating better conductor filling can be determined from calculation based on the desired device hole dimensions. Thus, the device holes formed from these photoresist openings can have more desirable features, and the semiconductor structure can have improved electrical characteristics.

For illustrative purposes, embodiments of the present disclosure are in view of the formation of channel holes in a three-dimensional memory device. In various embodiments, the methods and structure provided by the present disclosure can also be used in the formation of other device holes in other various semiconductor devices/structures. The device holes, including the channel holes, can be susceptible to etching loading effect during the formation. By using the disclosed methods and structure, these device holes can be less susceptible to etching loading effect, and the semiconductor devices/structures can have improved electrical performance/characteristics. FIGS. 4-10 illustrate a partially-formed three-dimensional memory structure at different stages of an exemplary fabrication process, according to some embodiments. The figures of the present disclosure are for illustrative purposes only and are not intended to scale or indicate the real dimensions of the structures.

Figure 4:
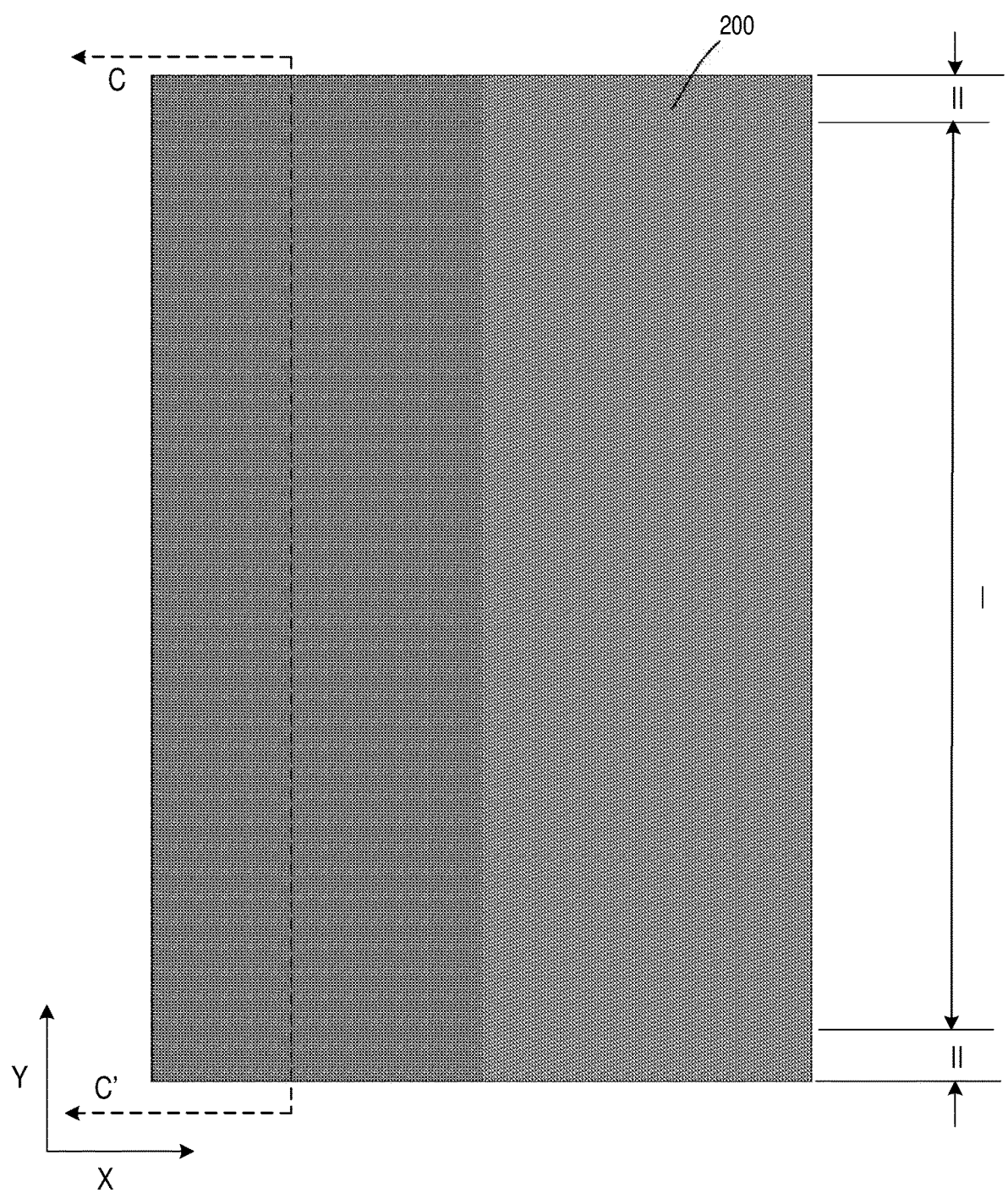
FIGS. 4-10 illustrate an exemplary fabrication process of a semiconductor structure, according to some embodiments.
Figure 5:
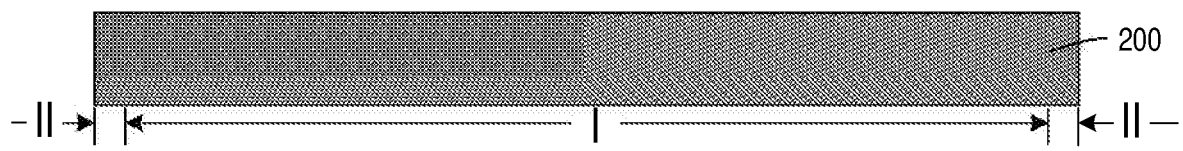

FIG. 4 illustrates a top view 400 of a substrate, and FIG. 5 illustrates a cross-sectional view of substrate 200 along C-C' direction, according to some embodiments. At the beginning of the fabrication process, substrate 200 can be provided. Substrate 200 can include a region for forming devices/structures, and a region adjacent to the region for forming devices. The x-y plane represents a plane (e.g., horizontal plane) nominally parallel to the top surface of substrate 200. For ease of description, in FIG. 4, the top surface of substrate 200 can be divided into region I and two region IIs. Region IIs can be positioned on one or more sides of region I. For illustrative purposes, in the present disclosure, Region IIs are located on the two sides of region I along the y-axis. In other various embodiments, Region IIs can also surround or partially surround region I. Region II can include any suitable region that has a change of opening arrangement (e.g., opening density) than first region I. A direction pointing from region II to region I is referred to a first direction (e.g., the y-axis), and a direction being perpendicular to first direction is referred to as a second direction (e.g., the x-axis). Substrate 200 can provide a fabrication base for the subsequent formation of other structures.

Substrate 200 can include any suitable materials. For example, substrate 200 can include silicon, germanium, silicon germanium, silicon carbide, gallium arsenide, indium arsenide, gallium indium arsenide, glass, gallium nitride, and/or other suitable III-V compound. Substrate 200 can also include silicon on insulator, and/or germanium on insulator. Suitable buried layer (e.g., functional and/or auxiliary layers) can also be formed in substrate 200. In some embodiments, substrate 200 includes silicon.

Figure 6:
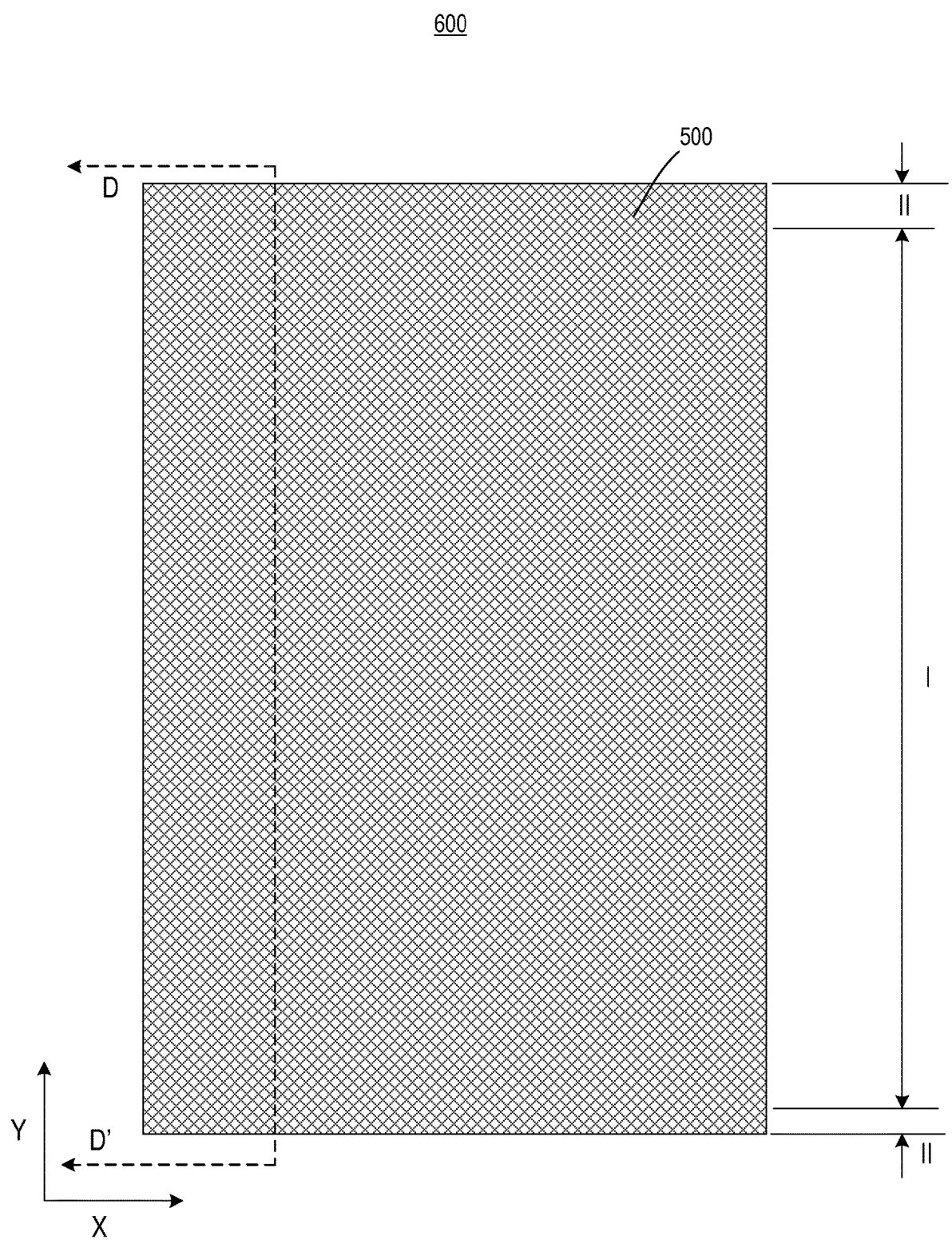
Figure 7:
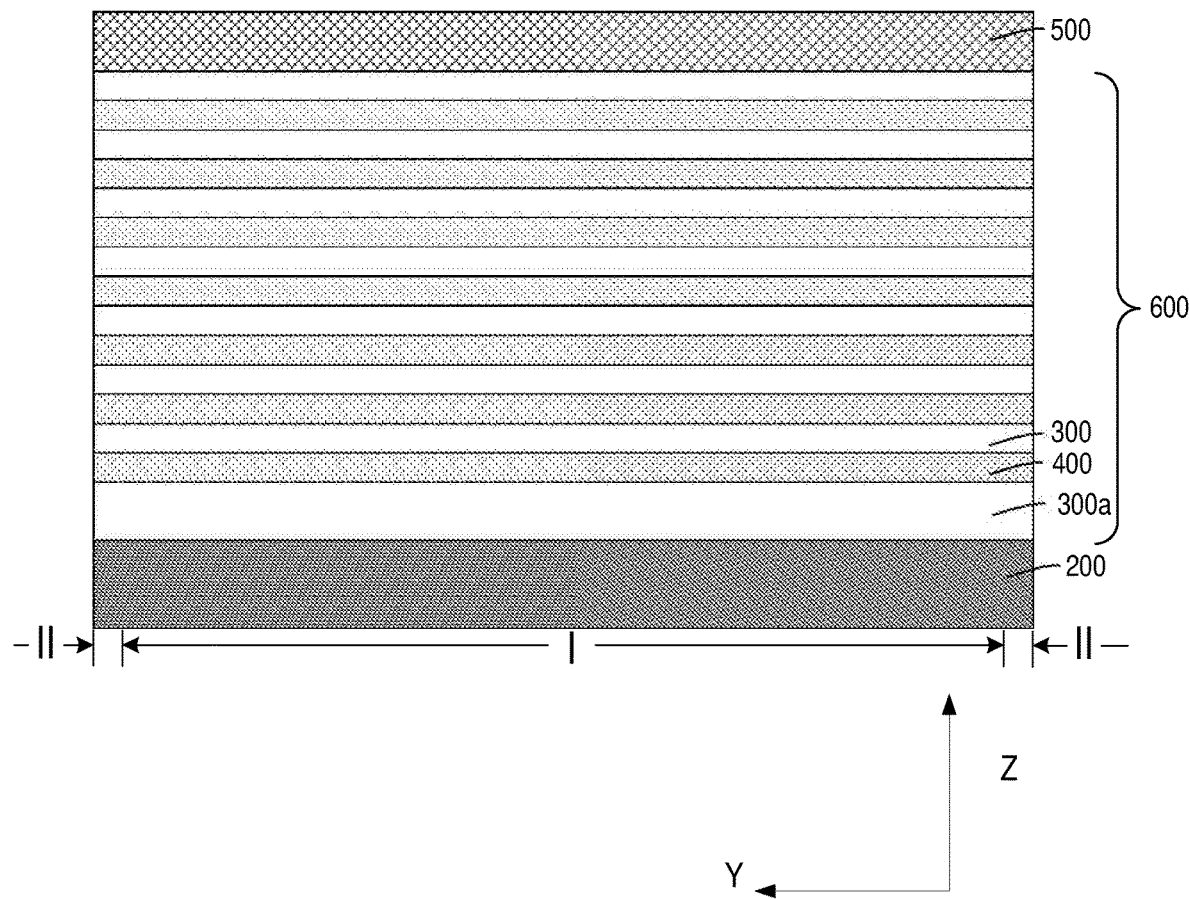

FIG. 6 illustrates a top view 600 of a structure having a hard mask layer formed over the substrate, and FIG. 7 illustrates a cross-sectional view 700 of the structure along D-D' direction, according to some embodiments. In some embodiments, the structure shown in FIGS. 6 and 7 includes a material layer 600 formed over substrate 200 and a hard mask layer 500 formed over material 600. In some embodiments, material layer 600 and hard mask layer 500 cover substrate 200. In some embodiments, material layer 600 includes a dielectric stack.

In some embodiments, dielectric stack 600 includes a plurality of first material layers and a plurality of second material layers stacking alternatingly. A first material layer can be formed between two adjacent second material layers, and vice versa. The second material layers can include any materials that are different from the first material layers. In some embodiments, a first material layer includes a sacrificial material layer 400 and a second material layer includes an insulating material layer 300. In some embodiments, each sacrificial material layer 400 and the underlying insulating material layer 300 form a dielectric pair. In subsequent fabrication operations, dielectric pairs can be etched incrementally (e.g., pair by pair) to form a staircase structure. Each dielectric pair can be etched to a different length and form a staircase. One stair case can include a sacrificial layer and an insulating layer. For example, the staircases can have a decreasing length along the vertical direction (e.g., the direction perpendicular to the x-y plane or the z-axis) and away from the top surface of substrate 200. In the present disclosure, a staircase structure refers to a set of surfaces that include at least two horizontal surfaces (e.g., along x-y plane) and at least two (e.g., first and second) vertical surfaces (e.g., along the z-axis) such that each horizontal surface is adjoined to a first vertical surface that extends upward from a first edge of the horizontal surface, and is adjoined to a second vertical surface that extends downward from a second edge of the horizontal surface. A "step" or "staircase" refers to a vertical shift in the height of a set of adjoined surfaces.

In some embodiments, the sacrificial material includes silicon nitride and the insulating material includes silicon oxide. In some embodiments, in the subsequent fabrication operations, sacrificial material layers can be removed and replaced with a suitable conductor material, e.g., tungsten, aluminum, and/or copper. The conductor layers can subsequently form the gate electrodes (e.g., word lines) of the memory device. In some embodiments, the conductor layers include tungsten. For illustrative purposes, only seven dielectric pairs are shown in the figures of the present disclosure. In various embodiments, other numbers of dielectric pairs, e.g., 64 dielectric pairs, can be formed. The number of dielectric pairs and the thickness of each material layer are determined based on different application requirements and should not be limited by the embodiments of the present disclosure.

In some embodiments, insulating material layer 300a at the bottom of dielectric stack 600 and over the top surface of substrate 200 has a sufficient thickness (e.g., being thicker than at least some of the insulating material layers). The reason for the thickness of insulating material layer 300a is described as follows. In subsequent operations, channel holes can be formed through dielectric stack 600 and into substrate 200 and a doped epitaxial layer can be formed at the bottom of a channel hole by a suitable epitaxial growth method, e.g., selective epitaxial growth (SEG). The channel hole can then be filled with insulating materials and semiconductor materials to form a semiconductor channel. To prevent the doped epitaxial layer from contacting the adjacent sacrificial material layer 400 to cause short circuit between the semiconductor channel and sacrificial material layer 400, in some embodiments, insulating material layer 300a has a greater thickness than at least some of the insulating material layers 300 of dielectric stack 600. Accordingly, the top surface of the epitaxial layer can be lower than the adjacent sacrificial material layer 400 so no contact is formed between substrate 200 and sacrificial material layer 400.

Hard mask layer 500 can include any suitable material that can be used as an etch mask for the etching of dielectric stack structure 600. For example, hard mask layer 500 can include carbon, silicon carbide, silicon nitride, and/or a composite stack layer of silicon nitride and silicon oxide. In some embodiments, hard mask layer 500 includes carbon.

In some embodiments, a photoresist layer can be formed over hard mask layer 500. The photoresist layer can be patterned to form a patterned photoresist layer. The patterned photoresist layer can be used to define the openings formed in hard mask layer 500, which is used as the etch mask for the etching of dielectric stack 600. The photoresist layer can be patterned using any suitable photolithography process.

Figure 8:
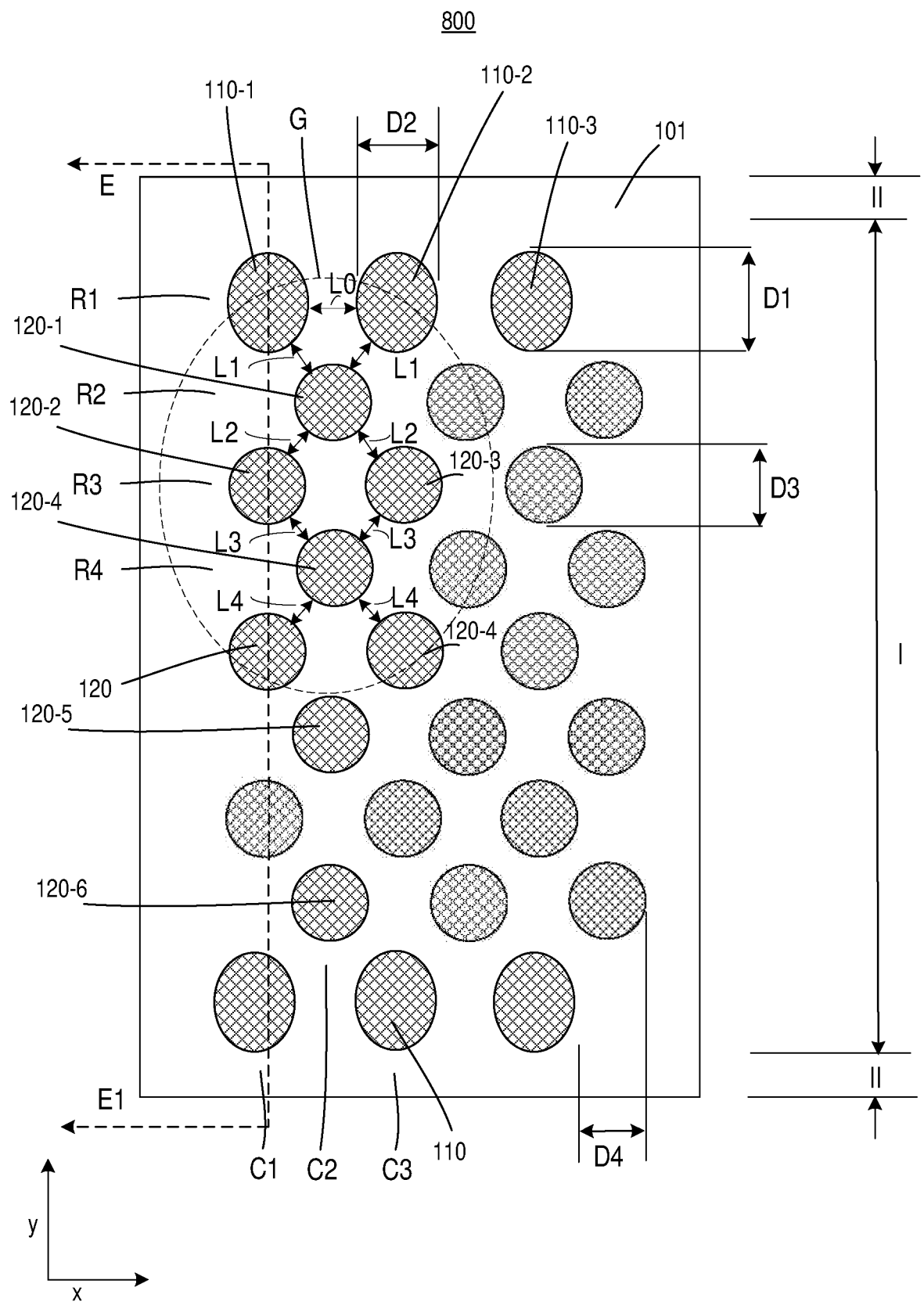
Figure 9:
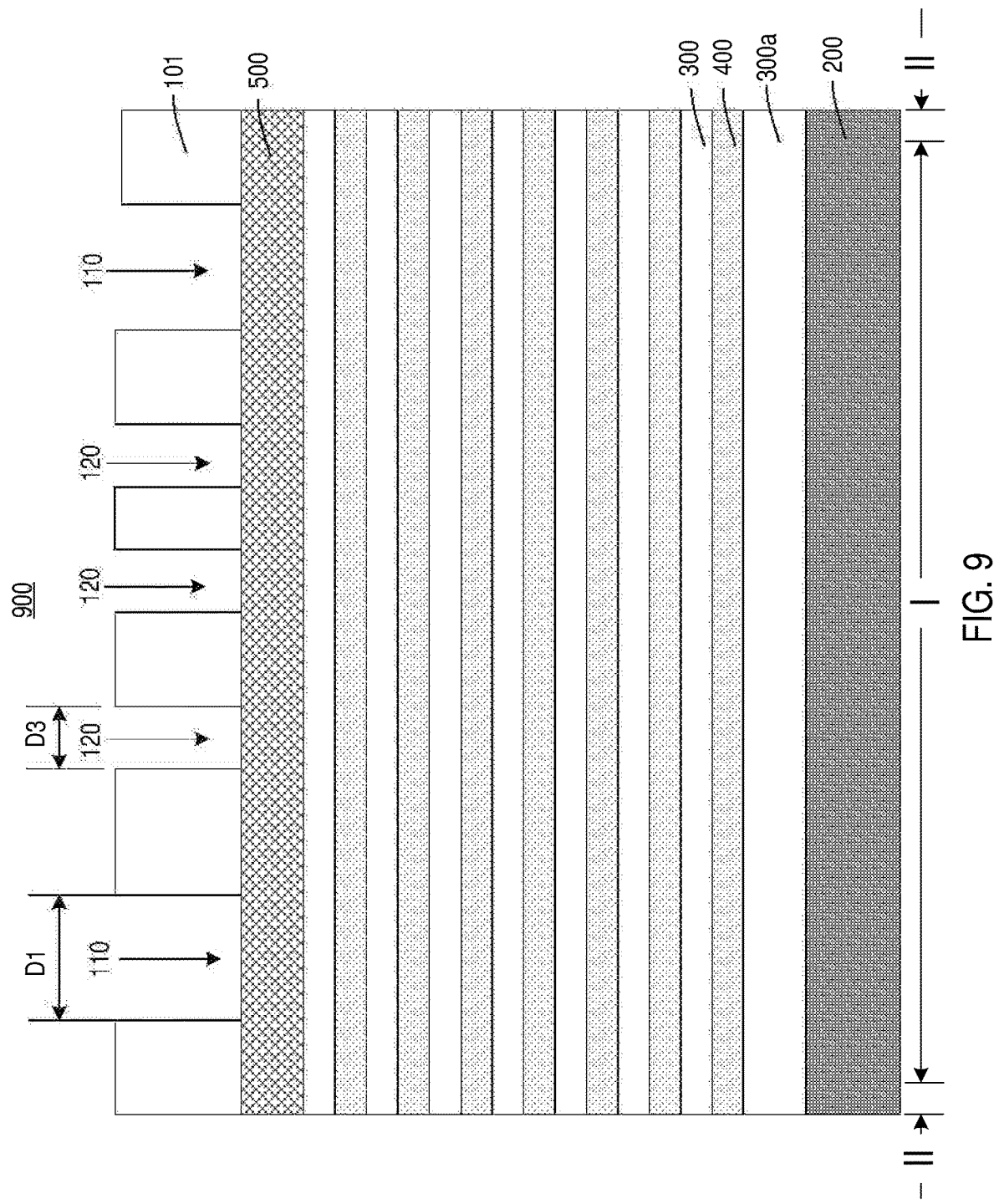

FIG. 8 illustrates a top view 800 of a structure having a patterned photoresist layer over the substrate, and FIG. 9 illustrates a cross-sectional view 900 of the structure along E-E1 direction, according to some embodiments. In some embodiments, the structure shown in FIGS. 8 and 9 includes patterned photoresist layer 101 over hard mask layer 500. Patterned photoresist layer 101 includes a plurality of openings in region I that expose portions of hard mask layer 500. The plurality of openings include a plurality of first openings and a plurality of second openings. First openings 110 can refer to the openings adjacent to second region II, and second openings 120 can refer to the rest of the openings. In some embodiments, the plurality of openings is arranged in an array in region I, first openings 110 are formed on the boundary of the array, and second openings 120 are formed between the first openings on the two boundaries of the array. In some embodiments, first openings 110 are aligned in two rows, each at one boundary between first region I and a second region II, and second openings 120 are aligned in rows between the two rows formed by first openings 110. The dimension or length of first opening 110 along the first direction (e.g., the y-axis) is D1, the dimension of width of first opening 110 along the second direction (e.g., the x-axis) is D2, the dimension or length of second opening 120 along the first direction is D3, and the dimension or width of second opening 120 along the second direction is D4. R1, R2, R3, R4 and R5 refer to the first to fifth rows from a boundary of the first region. C1, C2, and C3 refer to the first to third columns from a boundary of the array of openings. Region G (circled in FIG. 8) shows a plurality of spaces/distance between adjacent openings in patterned photoresist layer 101. First openings 110 can be in R1. The distance between two adjacent first openings 110 can be about L0. The distance between a first opening 110 and a nearest adjacent second opening 120 in R2 can be about L1. The distance between a second opening 120 in R2 and a nearest adjacent second opening 120 in R3 can be about L2. The distance between a second opening 120 in R3 and a nearest adjacent second opening 120 in R4 can be about L3. The distance between a second opening 120 in R4 and a nearest adjacent second opening 120 in R5 can be about L4. The distance between two openings refers to the shortest direct distance between the boundaries of the openings. These distances (e.g., L1-L5) can be or can determine the distances between two channel holes formed in subsequent fabrication operations. For ease of description, 9 rows of openings are shown, and each row has three openings.

The dimensions of the openings in patterned photoresist layer 101 can be transferred to hard mask layer 500 by any suitable patterning process, to determine the dimensions of mask openings subsequently formed in hard mask layer 500. The pattern transfer can allow the subsequently-formed patterned mask layer to have substantially same pattern as patterned photoresist layer 101. Because the patterned hard mask layer, formed subsequently, can be used as the etch mask for etching dielectric stack 600, first openings 110 and second openings 120 can determine or affect the etching of dielectric stack 600. For ease of description, openings formed in hard mask layer 500 are referred to as mask openings. The mask openings formed by etching through first openings are referred to as first mask openings, and the mask openings formed by etching through second openings are referred to as second mask openings.

As mentioned previously, channel holes formed from first openings 110 are more susceptible to under etch caused by etching loading effect. In some embodiments, to alleviate or prevent under etch in the channel holes formed from first openings 110, the size of first opening 110 is greater than the size of second opening 120. In the present disclosure, the term "size" can refer to the area of an object and/or the dimension of an object along a direction. For example, the area of first opening 110 can be about 2% to about 8% greater than the area of second opening 120. In some embodiments, the area of first opening 110 is about 5% greater than the area of second opening 120.

In some embodiments, of first opening 110, length D1 is greater than width D2. In some embodiments, width D2 of first opening 110 is greater than width D4 of second opening 120. In some embodiments, width D2 of first opening 110 is greater than length D3 of second opening 120. The reasons for the dimension arrangement are described as follows.

Because channel holes formed from first openings 110 can be most susceptible to under etch caused by etching loading effect, increasing the size of first mask opening can increase the amount of material etched through the first mask opening and allow substrate 200 to be exposed at the bottom of the channel hole formed from etching through the first mask opening. In some embodiments, it is desired the area increase of a first opening 110 to be as large as possible. Further, because in subsequent fabrication operations, sacrificial layers can be removed to form trenches between insulating layers and a conductor material can be flown to the trenches substantially along the y-axis, e.g., from the boundary of first region I to the inner portion of first region I, distance between openings of adjacent rows can gradually decrease along the y-axis to allow conductor material to fill in the trenches more easily because of the fluidity of the conductor material. In the present disclosure, the inner portion of first region I refers to a region away from the boundaries between first region I and other regions. For example, the inner portion can include a geometric center of the openings in region I. For example, the conductor material can start filling in the trenches from the space between R1 and R2. Because of fluidity, conductor material can fill in the trenches towards R5. By gradually decreasing the distance between openings of adjacent rows substantially along the y-axis, it can be easier for conductor to flow into the space between these openings.

However, the distance L0 between two adjacent first openings 110 in a same row (e.g., R1) and a first opening 110 and an adjacent second opening 120 may not be overly small, so that the conductor material can fill in the space between openings more completely and uniformly. Thus, in an example, length D1 of first opening 110 can be greater than width D2 of first opening 110, width D2 of first opening can be greater than width D4 of second opening 120, width D2 of first opening 110 can be equal to or greater than length D3 of second opening 120, and distance between adjacent openings along the y-axis can be L1≥L2≥L3≥L4, and so on. In some embodiments, width D2 of first opening 110 is greater than length D3 of second opening 120, and L1>L2>L3>L4. In some embodiments, the difference of distances between adjacent openings along the y-axis can be about 2 nm to about 3 nm. For example, L1 can be about 2 nm greater than L2. In some embodiments, the difference between width D2 of first opening 110 and width D4 of second opening 120 can be about 1 nm to about 2 nm. In some embodiments, the difference between width D2 of first opening 110 and width D4 of second opening 120 can be about 1 nm to about 2 nm.

Further, to improve the etching uniformity and ensure the electrical performance of the subsequently-formed semiconductor channels, the difference between length D1 and width D2 and the difference between length D3 and width D4 may not be overly large, so that the cross-sectional shapes of channel holes subsequently formed from the first mask openings and second mask openings can be sufficiently close to circular. In some embodiments, the difference between length D1 and width D2 can be about 2 nm to about 3 nm. In some embodiments, length D3 and width D4 can be substantially the same.

In various embodiments, the difference of distance between openings of adjacent rows can be the same or different. For example, the difference between distance L1 and distance L2 can be the same as or different as the difference between distance L2 and distance L3. In some embodiments, the difference of distances can change in a pre-determined pattern along the y-axis. In some embodiments, the difference of distances can be the same along the y-axis. The specific value of difference of distances can be dependent on the applications and designs and should not be limited by the embodiments of the present disclosure.

In some embodiments, the sizes of openings along a same row can vary to further compensate the etching loading effect. In some embodiments, region I can be adjacent to two or more other regions (e.g., second regions II) and the openings on the boundary can be susceptible to etching loading effect. In some embodiments, the sizes of openings along each boundary can have a greater size than the other openings not on the boundary. For ease of description, openings on the boundaries can be referred to as boundary openings, which include first openings. In some embodiments, the two openings at the two ends of a same row or a same column (e.g., the first opening and the last opening that are adjacent to the boundary between first region I and another region) can be boundary openings and can have a larger size than the openings in between. The reason for such arrangement can include that etching loading effect affects the etching profile most severely at the boundaries of an array. In an example, at least one of length D1 and width D2 of boundary opening 110-1 is greater than at least one of length D1 and width D2 of other first openings 110 between boundary opening 110-1 and another boundary opening 110 at the other end of R1. In another example, at least one of length D3 and width D4 of boundary opening 120-1 is greater than at least one of length D3 and width D4 of other second openings 120 between boundary opening 120-1 and another boundary opening 120 at the other end of R2. Such arrangement can be applied in one or more of other rows of the array. The difference in size between adjacent boundary openings along the y-axis can be the same or can vary. For example, the difference between length D1 and length D3 can be the same as or different as the difference between length D2 and length D3. The specific value of difference in sizes can be dependent on the applications and designs and should not be limited by the embodiments of the present disclosure.

In some embodiments, sizes of openings of a same row can vary (e.g., decrease) gradually towards the center/middle point of the row. In some embodiments, sizes of openings of a same column can vary (e.g., decrease) gradually towards the center/middle point of the column. For example, length D1 of first opening 110-1 can be greater than length D1 of first opening 110-2, and length D1 of first opening 110-3 can be greater than length D1 of first opening 110-2. In another example, width D4 of second opening 120-1 can be greater than width D4 of second opening 120-4, and width D4 of second opening 120-6 can be greater than width D4 of second opening 120-5. In some embodiments, sizes of openings (e.g., any opening of the array) can vary (e.g., decrease) along a direction towards the center (e.g., geometric center) of the array. For example, area of second opening 120-2 can be greater than area of second opening 120-4, and area of second opening 120-4 can be greater than the area of second opening 120-7. In some embodiments, the opening substantially at the center of the array (e.g., second opening 120-7) has the smallest dimensions compared to other openings of the array. In various embodiments, the change of sizes along a certain direction can be uniformly or non-uniformly. In some embodiments, openings of each row have the same sizes.

In some embodiments, openings in adjacent rows are arranged in a staggered manner, as shown in FIG. 8. The term "staggered" refers to, e.g., along the x-axis, openings of the $(N+1)^{th}$ row being aligned substantially with the spaces between openings of the $N^{th}$ row or $(N+2)^{th}$ row, where N is an integer. For example, second opening 120-1 can be arranged between first opening 110-1 and first opening 112 along the x-axis. In some embodiments, the distance between an opening (e.g., first opening 110 or second opening 120) and two adjacent openings in a same adjacent row can be the same. For example, the distance between second opening 120-1 and first opening 110-1 and distance between second opening 120-1 and first opening 110-2 can be the same, e.g., both being L1.

In some embodiments, the number of rows can be odd or even. When the array includes an odd number of rows, the distance between openings of two adjacent rows can decrease towards the middle row and the distance between a second opening 120 in the middle row to an adjacent second opening 120 in an adjacent row can be the same. When the array includes an even number of rows, the distance between openings of two adjacent rows can decrease towards the middle line (e.g., the line across the geometric center of the array) and the distance between two second openings 120 in the two rows closest to the middle line can be the same.

The openings in the array can have any suitable shapes. For example, circular, oval, rectangular, irregular, etc. The specific choice of shapes can be determined by various factors such as ease of fabrication, electrical performance of the subsequently-formed device, and so on. In some embodiments, first openings 110 can have an oval shape, with D1 being the major axis and D2 being the minor axis. In some embodiments, second openings 120 can have a substantially circular shape, with D3 and D4 being the diameter of second opening 120 and D3 being substantially the same as D4.

Further, patterned photoresist layer 101 can be used as the etch mask to pattern hard mask layer 500. Any suitable etch (e.g., wet etch and/or dry etch, depending on the material of hard mask layer 500) can be used to remove the portions of hard mask layer 500 exposed by the openings. Portions of dielectric stack 600 can be exposed by the patterned hard mask layer and pattern of patterned photoresist layer 101 can be transferred onto the patterned hard mask layer. First mask openings can be formed from first openings 110, and second mask openings can be formed from second openings 120. Further, patterned photoresist layer 101 can be removed.

Figure 10:
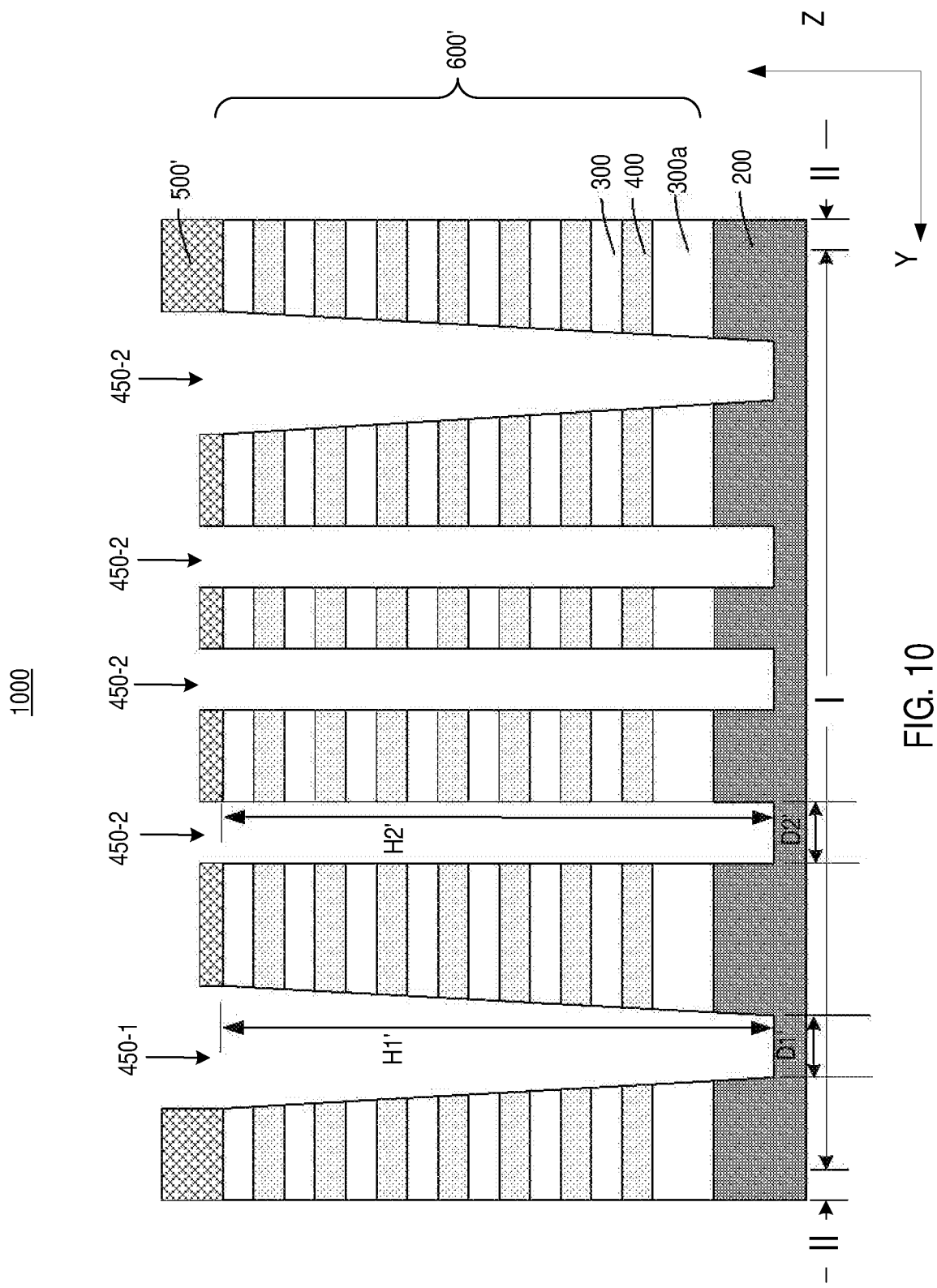

FIG. 10 illustrates a cross-sectional view 1000 of the structure illustrated in FIGS. 8 and 9 after hard mask layer 500 is patterned and channel holes 450 are formed in dielectric stack 600, according to some embodiments. The structure illustrated in FIG. 10 includes patterned hard mask layer 500' after being used as an etch mask to remove portions of dielectric stack 600 defined by the pattern of patterned hard mask layer 500' and corresponding to channel holes 450. Dielectric stack 600' refers to dielectric stack 600 after the removal of these portions. Channel holes formed from first mask openings are represented by elements 450-1, and channel holes formed from second mask openings are represented by elements 450-2. The etching of dielectric stack 600 to form channel holes 450 can be obtained by any suitable etches, depending on the materials of dielectric stack 600. For example, insulating material layers 300 and sacrificial material layers 400 can be etched using the same etching process or different etching processes, and the etching process(es) can include dry and/or wet etch. In some embodiments, channel holes 450 can be formed using one wet etching process that includes phosphoric acid.

As shown in FIG. 10, the bottoms of channel holes 450-1 expose substrate 200. In some embodiments, channel hole 450-1 can have a tapered cross section (e.g., the dimension at the top is greater than the dimension at the bottom along the y-axis) along the y-z plane. In some embodiments, dimension D1' of channel hole 450-1 at the bottom is substantially the same as dimension D2' of channel hole 450-2 along the y-axis. In some embodiments, depth H1' of channel hole 450-1 is substantially the same as depth H2' of channel hole 450-2 along the z-axis. In some embodiments, the aspect ratio of channel hole 450-1 (substantially equal to H1'/D1') is substantially the same as or lower than the aspect ratio of channel hole 450-2 (equal to H2'/D2').

Further, a doped epitaxial layer can be formed at the bottom of each channel hole 450, e.g., by a SEG process, and suitable insulating materials and semiconductor materials can be deposited to fill in channel holes 450 and form semiconductor channels. In some embodiments, a channel hole can include a dielectric core, a semiconductor channel layer, a memory layer, and a dielectric layer, arranged from the center to the boundary of the channel hole. Each layer can include any suitable materials. In some embodiments, the dielectric layer can include silicon oxide, the memory layer can include silicon nitride, the semiconductor channel layer can include silicon, and the dielectric core can include silicon oxide.

Further, dielectric stack 600' can be repetitively etched to form a staircase structure, and sacrificial layers 400 can be removed by a suitable isotropic etching process. The staircase structure can include a plurality of insulating layers and a plurality of sacrificial layers stacking alternating along the z-axis. Further, a suitable conductor material (e.g., tungsten, copper, and/or aluminum) can be deposited into the trenches formed between adjacent insulating layers to form the gate electrodes (e.g., word lines) of the subsequently-formed semiconductor structure. In some embodiments, the conductor material includes tungsten. In some embodiments, a staircase structure can also be formed before the formation of channel holes. The order of forming the staircase structure and the channel holes should be determined by different fabrication requirements and should not be limited by the embodiments of the present disclosure.

By applying the disclosed methods and structure, channel holes can have sufficient lengths, width, and/or depths for the deposition of the conductor material. Bottoms of the channel holes can expose the substrate so that the semiconductor channels can have sufficient electrical contact with the substrate. Under etch caused by etching loading effect can be reduced or prevented. Also, distance between adjacent channel holes can be arranged as disclosed so that during the formation of the gate electrodes, conductor material can fill in the trenches more easily and with improved uniformity. The formed gate electrodes can have higher uniformity. The electrical performance of the semiconductor device can be improved.

Figure 11:
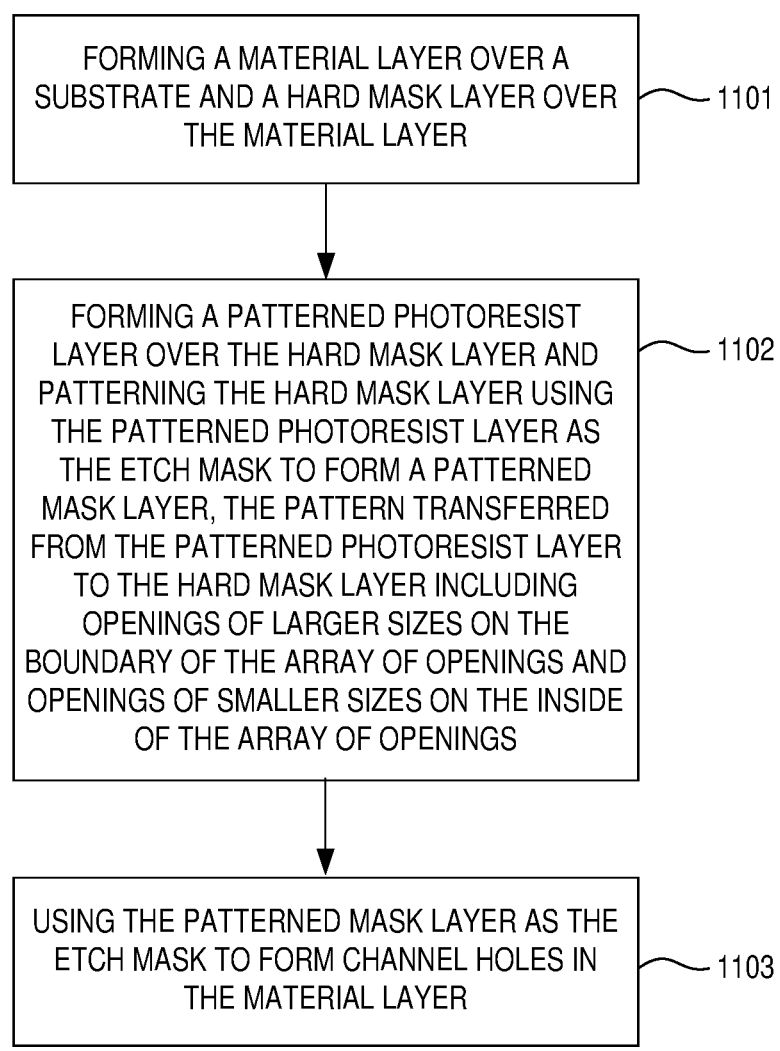
FIG. 11 illustrates a flow chart of an exemplary fabrication process for forming a semiconductor structure, according to some embodiments.

Embodiments of the present disclosure further provide a method for forming a semiconductor structure. FIG. 11 illustrates an exemplary fabrication process flow for the formation of the semiconductor structure, according to some embodiments. The operations illustrated in FIG. 11 are for illustrative purposes only. In various embodiments, the operations of FIG. 11 can be performed in another order or can vary.

At operation 1101, a material layer is formed over a substrate and a hard mask layer is formed over the material layer. The substrate, the material layer, and the hard mask layer can each include any suitable materials. In some embodiments, the substrate includes silicon, and the hard mask layer includes carbon. In some embodiments, the material layer includes a plurality of sacrificial material layers and a plurality of insulating material layers stacking alternatingly. In some embodiments, the sacrificial material layers include silicon nitride and the insulating material layers include silicon oxide. Detail description of the substrate, the material layer, and the hard mask can be referred to the illustration of FIGS. 6 and 7.

At operation 1102, a patterned photoresist layer is formed over the hard mask layer to pattern the hard mask layer and form a patterned mask layer using the patterned photoresist layer as the etch mask. The pattern of the patterned photoresist layer is transferred onto to the patterned hard mask layer. The pattern of the patterned photoresist layer includes openings that form an array, and the array includes openings of larger sizes on the boundary of the array and openings of smaller sizes on the inside of the array. In some embodiments, the patterned photoresist layer can be directly used as an etch mask for etching the underlying material layer. For example, the patterned photoresist can have sufficient thickness and can be processed (e.g., baked) to have sufficient stiffness to survive in the subsequent etching process.

In some embodiments, the patterned photoresist layer can be used to form device holes, e.g., channel holes, in a first region. The first region can be adjacent to one or more other regions, e.g., a second region. During the subsequent formation of device holes, the material layer can be etched to form channel holes to expose the substrate. To reduce or prevent under etch caused by the etching loading effect, openings on the boundary of the array can have greater sizes than the openings on the inside of the array. Openings on the boundary of the array (e.g., first openings) refers to the openings adjacent to other regions and/or openings at the ends of a row/column, and openings on the inside of the array (e.g., second openings) refers to the rest of the openings in the array. In some embodiments, the sizes of openings decrease gradually towards the center (e.g., geometric center) of the array. In some embodiments, the dimension of a first opening along a first direction pointing from the boundary to the center is greater than the dimension of the first opening along a second direction perpendicular to the first direction. In some embodiments, the dimension of a first opening along the first direction is greater than the dimension of a second opening along the first direction. In some embodiments, the distance between adjacent openings of adjacent rows decreases along the first direction towards the center of the array to allow conductor material to fill in the material layer more easily and with higher uniformity. The pattern of the patterned photoresist layer can be transferred to the patterned mask layer by a suitable etching process on the hard mask layer. First mask openings can be formed based on first openings, and second mask openings can be formed based on second openings. After the patterned mask layer is formed, the patterned photoresist layer can be removed. Detailed description of the openings can be referred to the illustration of FIGS. 8 and 9.

At operation 1103, the patterned mask layer is used as the etch mask to form channel holes in the material layer. A suitable etching process can be performed to remove portions of the material layer exposed by the patterned mask layer. Accordingly, channel holes can be formed and the bottom of the channel holes can expose the substrate. First channel holes formed based on first mask openings can have greater dimensions than second channel holes formed based on second mask openings. In some embodiments, the bottoms of the first channel holes can expose the substrate. In some embodiments, the depths of the first channel holes can be substantially the same as the depths of the second channel holes. Details of the structure and the formation of the channel holes can be referred to the illustration of FIG. 10.

Further, a doped epitaxial layer can be formed at the bottom of each channel hole, e.g., by a SEG process, and suitable insulating materials and semiconductor materials can be deposited to fill in channel holes and form semiconductor channels. In some embodiments, a channel hole can include a dielectric core, a semiconductor channel layer, a memory layer, and a dielectric layer, arranged from the center to the boundary of the channel hole. Each layer can include any suitable materials. In some embodiments, the dielectric layer can include silicon oxide, the memory layer can include silicon nitride, the semiconductor channel layer can include silicon, and the dielectric core can include silicon oxide.

Further, the material layer can be repetitively etched to form a staircase structure, and sacrificial layers can be removed by a suitable isotropic etching process. The staircase structure can include a plurality of insulating layers and a plurality of sacrificial layers stacking alternating along a direction perpendicular to the substrate. Further, a suitable conductor material (e.g., tungsten) can be deposited into the trenches formed between adjacent insulating layers to form the gate electrodes (e.g., word lines) of the subsequently-formed semiconductor structure.

Figure 12:
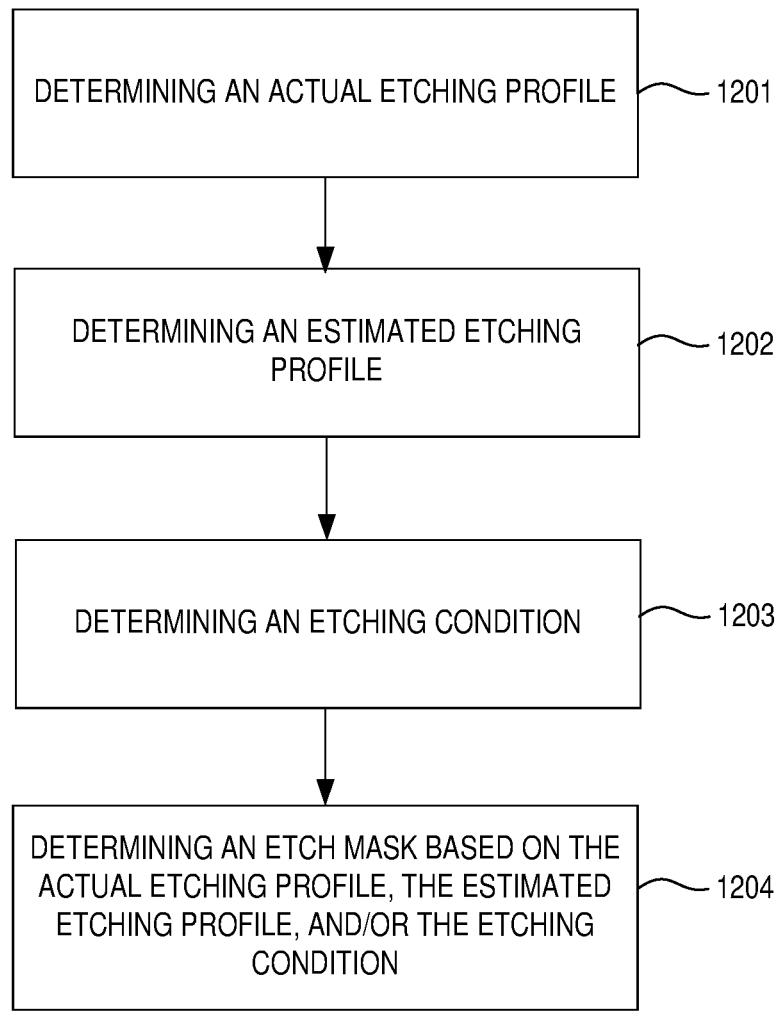
FIG. 12 illustrates a flow chart of an exemplary method for determining the size of a device opening in a material layer, according to some embodiments.

Embodiments of the present disclosure further provide a method for determining the size (e.g., dimensions) of a device opening in a material layer over a substrate using an etching process. FIG. 12 illustrates an exemplary flow chart of the method, according to some embodiments. The operations illustrated in FIG. 12 are for illustrative purposes only. In various embodiments, the operations of FIG. 12 can be performed in another order or can vary.

At operation 1201, an actual etching profile is determined. In some embodiments, the actual etching profile includes the etching profile of the conventional technology or an etching profile that needs to be improved. For example, the actual etching profile can include the etching profile of a device opening that is under etched because of etching loading effect and can have an undesirably high aspect ratio.

At opening 1202, an estimated etching profile is determined. In some embodiments, the estimated etching profile includes the desired etching profile required by the fabrication process. For example, the estimated etching profile can include the etching profile of a device opening with sufficient width and depth, e.g., a channel hole that exposes the substrate at the bottom of the channel hole and has a desirably low aspect ratio.

At opening 1203, an etching condition is determined. In some embodiments, the etching condition includes various factors that can affect the etching process. For example, the factors can include etchants, etching types, chamber condition, locations of the material being etched, the material being etched, etc.

At opening 1204, a etch mask is determined based on the actual etching profile, the estimated etching profile, and/or the etching condition. In some embodiments, the etch mask can be patterned by a patterned photoresist layer (e.g., an initial etch mask). The pattern of the patterned photoresist layer can be transferred onto the etch mask. The pattern of the patterned photoresist can be determined based on the estimated etching profile, the etching condition, and/or the estimated etching profile.

By using the method, the difference between the actual etching profile and the estimated etching profile can be determined, and the etch mask can be design to compensate the difference so that the formed device opening can have desired features, e.g., depth, width, aspect ratio, etc.

In some embodiments, a method for forming a plurality of device openings includes forming a material layer over a first region and a second region of a substrate, the first region being adjacent to the second region, forming a mask layer over the material layer, the mask layer covering the first region and the second region, and forming a patterning layer over the mask layer, the patterning layer covering the first region and the second region and including a plurality of openings corresponding to the first region. The plurality of openings includes a first opening adjacent to a boundary between the first region and the second region and a second opening further away from the boundary than the first opening. Along a plane parallel to a top surface of the substrate, a size of the first opening is greater than a size of the second opening. The method further includes patterning the mask layer using the patterning layer to form a patterned mask layer and patterning the material layer using the patterned mask layer.

In some embodiments, a semiconductor structure includes a substrate, the substrate including a first region and a second region being adjacent to the first region, a material layer over the first region and the second region, and a plurality of device openings in the material layer corresponding to the first region. A size of a first device opening being closest to a boundary between the first region and the second region is greater than a size of a second device opening being further away to the boundary than the first device opening. A bottom of the first device opening exposes the substrate.

In some embodiments, a method for determining size of a device opening in a fabrication process includes determining an actual etching profile of the device opening, determining an estimated etching profile of the device opening, determining an etching condition of the device opening, and determining an etch mask based on one or more of the actual etching profile, the estimated etching profile, and the etching condition. The etch mask includes a mask opening for forming a non-under etched profile of the device opening.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A semiconductor structure, comprising:
   a substrate, the substrate comprising a first region and a second region being adjacent to the first region;
   a stack structure over the first region and the second region, wherein the stack structure comprises a plurality of conductor layers and a plurality of insulating layers stacking alternatingly along a direction perpendicular to the top surface of the substrate; and
   an array of device openings each penetrating the stack structure to expose the substrate, wherein:
   the array of device openings comprises a first row of first device openings adjacent to a boundary between the first region and the second region and at least two rows of second device openings further away from the boundary respectively,
   a first length of a top aperture of each first device opening along a first direction parallel to the top surface of the substrate and pointing from the second region to the first region is greater than a second length of a top aperture of each second device opening along the first direction,
   the first length of the top aperture of each first device opening along the first direction is greater than a first width of the top aperture of each first device opening along a second direction parallel to the top surface of the substrate and being perpendicular to the first direction, and
   a third length of a bottom aperture of each first device opening along the first direction is substantially same as a fourth length of a bottom aperture of each second device opening along the first direction.

2. The semiconductor structure of claim 1, wherein the second length of the top aperture of each second device opening along the first direction is substantially same as a second width of the top aperture of each second device opening along the second direction.

3. The semiconductor structure of claim 2, wherein
the first length of each first device opening along the first direction is greater than the first width of each first opening along the second direction by about 2 to about 3 nm;
the first width of each first device opening along the second direction is greater than the second width of each second opening along the second direction by about 1 to about 2 nm; and
the first width of each first device opening along the second direction is greater than the second length of each second device opening along the first direction by about 1 to about 2 nm.

4. The semiconductor structure of claim 1, wherein the first device openings have a substantially same size and have an oval shape.

5. The semiconductor structure of claim 1, wherein the second device openings have a substantially same size and have a circular shape.

6. The semiconductor structure of claim 1, wherein rows of the array of device openings are arranged in a staggered configuration along the first direction.

7. The semiconductor structure of claim 1, wherein the second device openings are further arranged at least a third row further away from the boundary along the first direction and adjacent to the second row.

8. The semiconductor structure of claim 7, wherein sizes of the first device openings in the first row and the second device openings in the second row and the third row decrease along the first direction.

9. The semiconductor structure of claim 1, wherein the second region and the first region further comprises one or more boundaries in between, and sizes of device openings decrease along a direction from each boundary to an inner portion of the array of device openings.

10. The semiconductor structure of claim 7, wherein a distance L1 between one first device opening in the first row and an adjacent second opening in a second row is greater than a distance L2 between the second opening in the second row and an adjacent second opening in the third row.

11. The semiconductor structure of claim 10, wherein the distance L2 is greater than a distance L3 between the second opening in the third row and an adjacent second opening in a fourth row.

12. The semiconductor structure of claim 11, wherein the distance L3 is greater than a distance L4 between the second opening in the fourth row and an adjacent second opening in a fifth row.

13. The semiconductor structure of claim 1, wherein the second region has two boundaries with the first region and the first region is disposed between the two boundaries along the first direction.

14. The semiconductor structure of claim 13, wherein the array including an odd number of rows, a distance between adjacent device openings of two adjacent rows decreases towards a middle row of the array and a distance between a device opening in the middle row to an adjacent device opening in an adjacent row is same.

15. The semiconductor structure of claim 13, wherein the array including an even number of rows, a distance between the adjacent device openings of two adjacent rows decreases towards a middle line of the array and a distance between two second device openings in the two rows closest to the middle line is same.

16. The semiconductor structure of claim 1, wherein the plurality of conductor layers includes one or more of tungsten, aluminum, and copper.

17. The semiconductor structure of claim 1, wherein:
the first length is greater than the third length; and
the second length is substantially the same as the fourth length.

* * * * *